United States Patent
Kaise

(10) Patent No.: US 9,366,931 B2
(45) Date of Patent: Jun. 14, 2016

(54) LIQUID CRYSTAL DISPLAY PANEL

(75) Inventor: Yasuyoshi Kaise, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 227 days.

(21) Appl. No.: 14/113,127

(22) PCT Filed: Apr. 18, 2012

(86) PCT No.: PCT/JP2012/060448
§ 371 (c)(1),
(2), (4) Date: Oct. 21, 2013

(87) PCT Pub. No.: WO2012/144517
PCT Pub. Date: Oct. 26, 2012

(65) Prior Publication Data
US 2014/0036194 A1 Feb. 6, 2014

(30) Foreign Application Priority Data

Apr. 22, 2011 (JP) .................. 2011-095928

(51) Int. Cl.
*G02F 1/136* (2006.01)
*G02F 1/1368* (2006.01)
*H01L 27/12* (2006.01)
(Continued)

(52) U.S. Cl.
CPC ........ *G02F 1/1368* (2013.01); *G02F 1/136209* (2013.01); *G02F 1/136286* (2013.01); *H01L 27/1214* (2013.01); *H01L 29/78633* (2013.01);
(Continued)

(58) Field of Classification Search
CPC .............. H01L 27/1214; H01L 29/78633; H01L 29/78645; H01L 29/78696; G02F 1/1368; G02F 1/136209; G02F 1/136286

USPC ................................... 349/46, 42–43
See application file for complete search history.

(56) References Cited

U.S. PATENT DOCUMENTS

| | | | |
|---|---|---|---|
| 6,252,248 B1 * | 6/2001 | Sano et al. | 257/59 |
| 7,558,445 B2 * | 7/2009 | Yasukawa | 385/2 |
| 2002/0196517 A1 * | 12/2002 | Nimura | 359/245 |

(Continued)

FOREIGN PATENT DOCUMENTS

| CN | 102253548 A | 11/2011 |
|---|---|---|
| JP | 2001-033822 A | 2/2001 |

OTHER PUBLICATIONS

Official Communication issued in International Patent Application No. PCT/JP2012/060448, mailed on Jun. 26, 2012.

*Primary Examiner* — Hoan C Nguyen
(74) *Attorney, Agent, or Firm* — Keating & Bennett, LLP

(57) ABSTRACT

The present invention aims to provide a liquid crystal display panel having a structure in which a plurality of gate electrodes are arranged on a continuous semiconductor layer and still capable of suppressing increase of a parasitic capacitance between a source region and a drain region. The liquid crystal display panel of the invention includes a thin film transistor. The thin film transistor includes: a base insulating film; a semiconductor layer extending linearly at least from a first portion to a second portion; a source electrode; a drain electrode; and gate electrodes, respectively, to cover the semiconductor layer with a gate insulating film therebetween. A light shielding film is arranged to cover each projection region corresponding to projection of the gate electrode. The light shielding film is arranged in the form of a plurality of light shielding film elements. The light shielding film elements each cover one or more projection regions.

2 Claims, 15 Drawing Sheets

(51) Int. Cl.
*H01L 29/786* (2006.01)
*G02F 1/1362* (2006.01)

(52) U.S. Cl.
CPC .... *H01L 29/78645* (2013.01); *H01L 29/78696* (2013.01); *G02F 2001/13606* (2013.01)

(56) References Cited

U.S. PATENT DOCUMENTS

2009/0213290 A1\* 8/2009 Ochiai et al. .................... 349/48
2011/0284851 A1 11/2011 Liu et al.

\* cited by examiner

LIQUID CRYSTAL DISPLAY PANEL

TECHNICAL FIELD

The present invention relates to a liquid crystal display panel.

BACKGROUND ART

A liquid crystal display panel has a display region. In this display region, usually a plurality of pixels are arranged. Further, in order to control the state of application of a voltage to a liquid crystal layer for each pixel, a thin film transistor is generally arranged at each pixel.

Japanese Patent Laying-Open No. 2001-33822 (PTD 1) discloses in FIG. 2 a configuration of a thin film transistor in which two gate electrodes are arranged between a source electrode and a drain electrode. Above two locations along an extending semiconductor layer, the gate electrodes are arranged, respectively, and the source electrode and the drain electrode are connected, respectively, to one end and the opposite end of the semiconductor layer. In the semiconductor layer, a portion located below each gate electrode is a channel region. In order to prevent a phenomenon that leakage current is caused by light entering the channel region, a light shielding film is formed to contact a surface of a substrate. According to PTD 1, the light shielding film is made of a metal such as Mo, Ta, Al, Cr, or the like, or an alloy thereof.

CITATION LIST

Patent Document

PTD 1: Japanese Patent Laying-Open No. 2001-33822

SUMMARY OF INVENTION

Technical Problem

In plan view, the light shielding film covers not only a projection region of the surface of the substrate, namely a region corresponding to the gate electrode's projection on the surface of the substrate, but also a region around the projection region. Here, regions in the semiconductor layer that are located on lateral sides, respectively, of the gate electrode's projection region therein are called source region and drain region, respectively. Then, both the source region and the drain region as well as the gate electrode are covered with the light shielding film on the substrate side.

In the case where two gate electrodes are arranged between a source electrode and a drain electrode, a region under each gate electrode is a channel region, and therefore channel regions are present at two locations, respectively. In this case, as shown in FIG. 18, one light shielding film 110 covers these two channel regions together. In FIG. 18, a semiconductor layer 5 includes regions covered with gate electrodes 9 respectively and these regions are channel regions. A cross section cut along a line XIX-XIX and viewed in the direction of the arrows in FIG. 18 is shown in FIG. 19. In semiconductor layer 5, a portion in which a source region 5a, a channel region 5b, a drain region 5c, a source region 5d, a channel region 5e, and a drain region 5f are located in this order is wholly covered with one light shielding film 110. This design where light shielding film 110 is arranged to cover these regions together is made as a matter of course for the sake of saving space.

However, in such a case where a plurality of channel regions are covered together by one light shielding film 110, a large parasitic capacitance is newly generated between the source region and light shielding film 10 and between the drain region and light shielding film 110 because light shielding film 110 is electrically conductive, which influences a plurality of channel regions.

In addition to the example of the two-dimensional layout shown in FIG. 18, a modification as shown in FIG. 20 is also possible. In the case of the example shown in FIG. 20, the light shielding film is not arranged to completely follow the route along which the semiconductor layer extends. In contrast to the semiconductor layer extending in the form of a detour, the light shielding film extends in the form of a shortcut. Even if this two-dimensional layout is employed, a plurality of channel regions covered together by one light shielding film is still accompanied by a similar problem that a new large parasitic capacitance is generated between the source region and light shielding film 10 and between the drain region and the light shielding film, which influences a plurality of channel regions.

While the description given above is of an example where two gate electrodes are arranged between the source electrode and the drain electrode, the same result occurs as well to the case where three or more gate electrodes are arranged between the source electrode and the drain electrode.

In view of the above, an object of the present invention is to provide a liquid crystal display panel having a structure in which a plurality of gate electrodes are arranged on a continuous semiconductor layer and still capable of suppressing increase of a parasitic capacitance between a source region and a drain region.

Solution to Problem

In order to achieve the above object, a liquid crystal display panel of the present invention includes: a first transparent substrate having a main surface which includes a display region having a plurality of pixels; a second transparent substrate arranged opposite to the main surface in at least a region including the display region; and a liquid crystal layer arranged to be sandwiched between the first transparent substrate and the second transparent substrate. Thin film transistors associated with the plurality of pixels respectively are provided in the main surface. The thin film transistors each include, in order of closeness to the first transparent substrate: a base insulating film covering at least a part of the main surface; a semiconductor layer extending linearly at least from a first portion to a second portion in plan view to cover a part of the base insulating film; a gate insulating film covering at least a part of the semiconductor layer; a source electrode electrically connected, in the first portion, to the semiconductor layer; a drain electrode electrically connected, in the second portion, to the semiconductor layer; and gate electrodes arranged at two or more locations, respectively, to cover the semiconductor layer with the gate insulating film interposed therebetween, the two or more locations being located along a path extending along the semiconductor layer from the first portion to the second portion in plan view. A light shielding film is arranged between the base insulating film and the first transparent substrate to cover each projection region of the main surface, the projection region being a region corresponding to projection of the gate electrode on the main surface. The light shielding film is arranged in the form of a plurality of light shielding film elements separated from each other in plan view, the light shielding film elements each covering one or more of projection regions of the gate electrodes.

Advantageous Effects of Invention

In accordance with the present invention, the light shielding film is arranged in the form of a plurality of light shielding film elements separated from each other, and each light shielding film element covers the channel region from below. Therefore, in a structure in which a plurality of gate electrodes are arranged on a continuous semiconductor layer, increase of a parasitic capacitance between the source region and the drain region sandwiching each channel region therebetween can be suppressed.

DESCRIPTION OF EMBODIMENTS

First Embodiment

Figure 1:
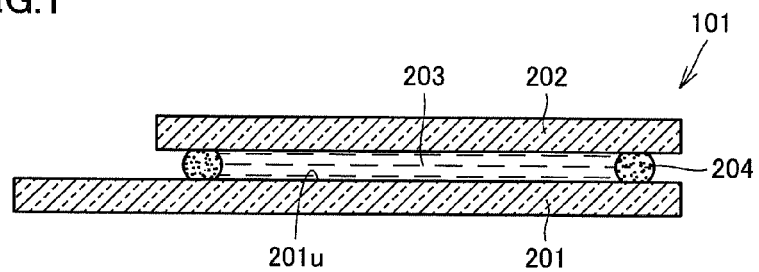
FIG. 1 is a cross-sectional view of a liquid crystal display panel in a first embodiment of the present invention.

Referring to FIGS. 1 to 5, a liquid crystal display panel in a first embodiment of the present invention will be described. As shown in FIG. 1, liquid crystal display panel 101 in the present embodiment includes a first transparent substrate 201, a second transparent substrate 202, and a liquid crystal layer 203. First transparent substrate 201 and second transparent substrate 202 are glass substrates. Liquid crystal layer 203 is surrounded by a seal member 204. In FIG. 1, structures formed in the surfaces of first transparent substrate 201 and the second transparent substrate are not shown.

Figure 2:
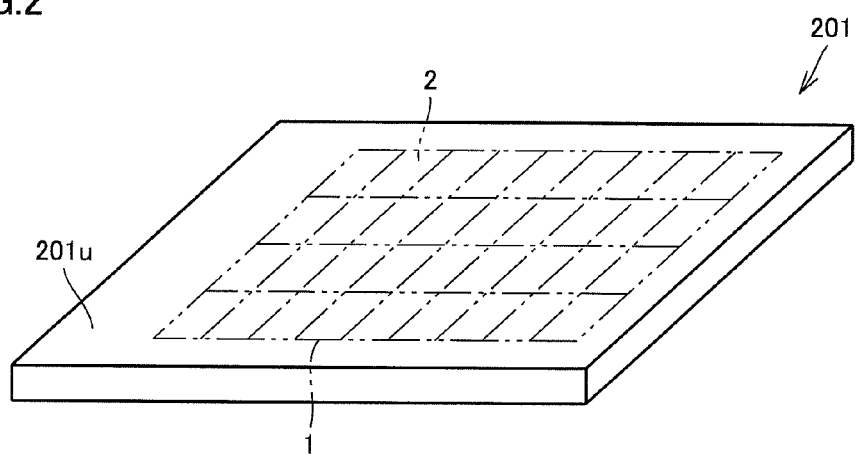
FIG. 2 is a perspective view of only a first transparent substrate removed from the liquid crystal display panel in the first embodiment of the present invention.

FIG. 2 shows a perspective view of only first transparent substrate 201 removed from liquid crystal display panel 101. FIG. 2 shows a conceptual region defined in a main surface 201$u$ of first transparent substrate 201. Here, a display region 1 is defined in a part of main surface 201$u$. Display region 1 is partitioned into a plurality of pixels 2. Actually, when liquid crystal display panel 101 is fabricated, a variety of structures are formed in main surface 201$u$ of first transparent substrate 201.

Figure 3:
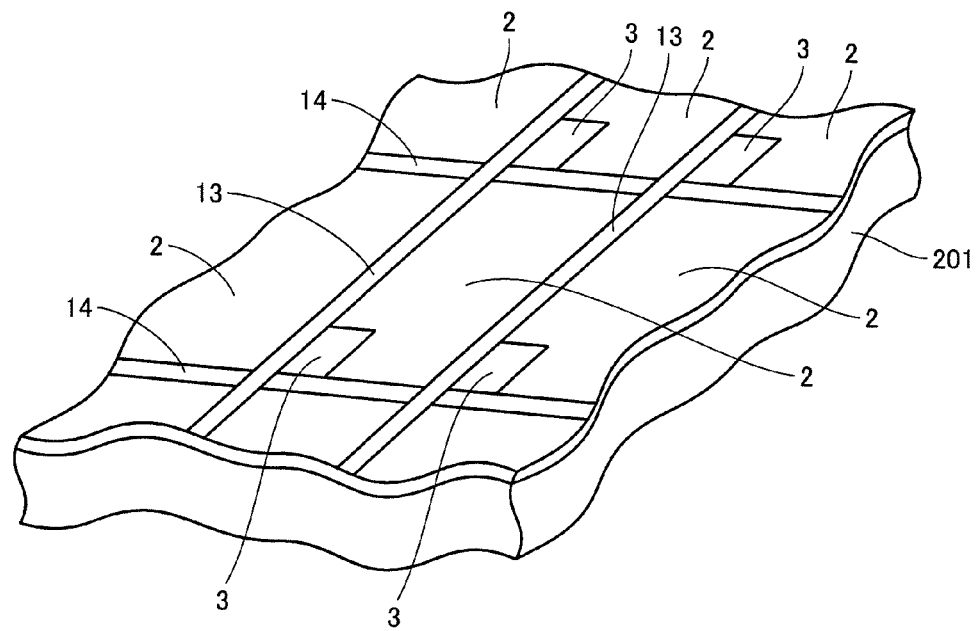
FIG. 3 is a partial enlarged perspective view of the first transparent substrate of the liquid crystal display panel as well as structures formed on a surface of the substrate in the first embodiment of the present invention.
Figure 4:
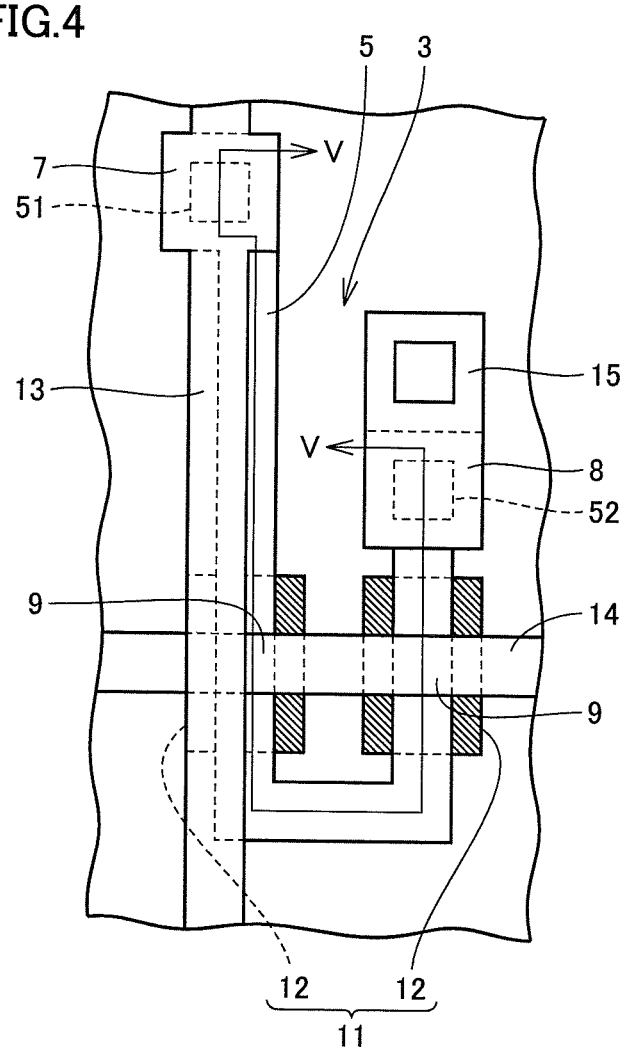
FIG. 4 is a partial plan view of the liquid crystal display panel in the first embodiment of the present invention.

First transparent substrate 201 and the structures formed in its surface are roughly shown in FIG. 3. In main surface 201$u$, a plurality of source lines 13 are disposed in parallel with each other. A plurality of gate lines 14 are disposed perpendicularly to a plurality of source lines 13. A substantially rectangular region enclosed by two source lines 13 and two gate lines 14 is one pixel 2. In the vicinity of an intersection of source line 13 and gate line 14, a thin film transistor 3 is formed. A plan view of thin film transistor 3 and its vicinity is shown in FIG. 4. FIG. 4 shows, as an example of thin film transistor 3, an example of the so-called dual U-shape form. "Dual" means a type having two gate electrodes. As shown in FIG. 4, semiconductor layer 5 extends in a U-shape form from a first portion 51 to a second portion 52. A cross section cut along a line V-V and viewed in the direction of the arrows in FIG. 4 is shown in FIG. 5.

Liquid crystal display panel 101 in the present embodiment includes first transparent substrate 201 having main surface 201$u$ which includes display region 1 having a plurality of pixels 2, second transparent substrate 202 arranged opposite to main surface 201$u$ in at least a region including display region 1, and liquid crystal layer 203 arranged to be sandwiched between first transparent substrate 201 and second transparent substrate 202. In main surface 201$u$, thin film transistors 3 associated with a plurality of pixels 2, respectively, are disposed. As shown in FIGS. 4 and 5, thin film transistors 3 each include, in order of closeness to first transparent substrate 201: a base insulating film 4 covering at least a part of main surface 201$u$; a semiconductor layer 5 extending linearly at least from first portion 51 to second portion 52 in plan view to cover a part of base insulating film 4; a gate insulating film 6 covering at least a part of semiconductor layer 5; a source electrode 7 electrically connected, in first portion 51, to semiconductor layer 5; a drain electrode 8 electrically connected, in second portion 52, to semiconductor layer 5; and gate electrodes 9 arranged at two or more locations, respectively, to cover semiconductor layer 5 with gate insulating film 6 interposed therebetween, the two or more locations being located along a path extending along semiconductor layer 5 from first portion 51 to second portion 52 in plan view. A light shielding film 11 is arranged between base insulating film 4 and first transparent substrate 201 to cover each projection region 10 of main surface 201u, which is a region corresponding to projection of gate electrode 9 on main surface 201u. Light shielding film 11 is arranged in the form of a plurality of light shielding film elements 12 separated from each other in plan view, and light shielding film elements 12 each cover one or more projection regions 10 of gate electrodes 9.

Figure 5:
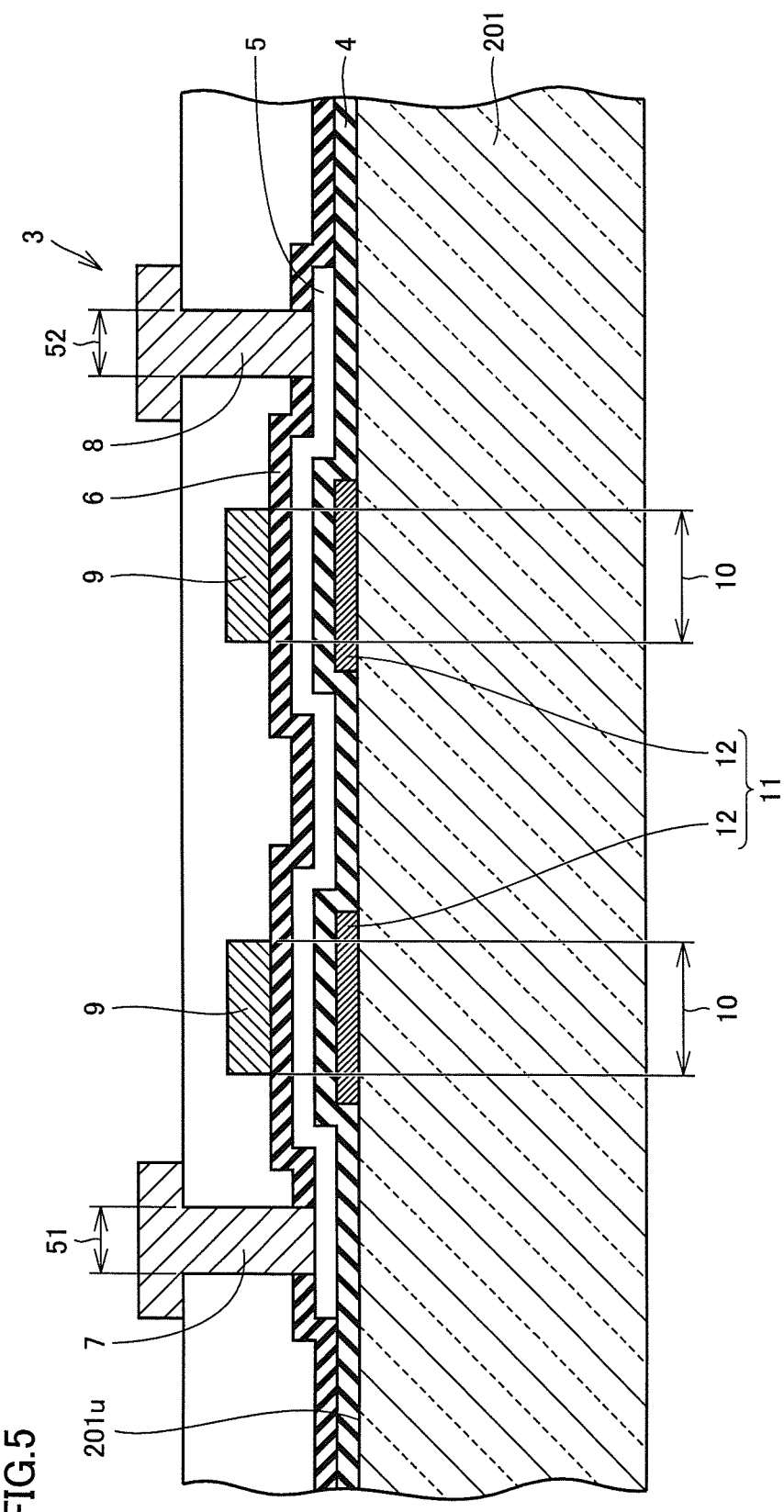
FIG. 5 is a cross-sectional view cut along a line V-V and viewed in the direction of arrows in FIG. 4.

In FIG. 5, the components have respective lengths which are relatively made longer or shorter for the sake of convenience of the description. This is particularly applied to the lateral length. In FIG. 5, source line 13 and gate line 14 are not shown. While FIG. 4 also shows a contact 15 provided for electrical connection to a pixel electrode, the pixel electrode is not shown. Contact 15 is not shown in FIG. 5. As shown in FIGS. 4 and 5, thin film transistor 3 includes two gate electrodes 9 along one semiconductor layer 5. Gate electrode 9 is a part of gate line 14. Gate line 14 includes a portion overlapping semiconductor layer 5 and this portion serves as gate electrode 9.

In semiconductor layer 5, a portion located in a projection region 10 of gate electrode 9 is a channel region. The fact that light shielding film element 12 covers projection region 10 means, in other words, light shielding film element 12 covers the channel region from below.

In the present embodiment, rather than the configuration in which all of a plurality of channel regions in thin film transistor 3 are covered by one light shielding film 11 from below, the configuration is given in which light shielding film 11 is arranged in the form of a plurality of light shielding film elements 12 and each light shielding film element 12 covers a channel region from below. Therefore, in the structure where a plurality of gate electrodes are arranged on a continuous semiconductor layer, increase of a parasitic capacitance between a source region and a drain region sandwiching each channel region therebetween can still be suppressed.

Figure 6:
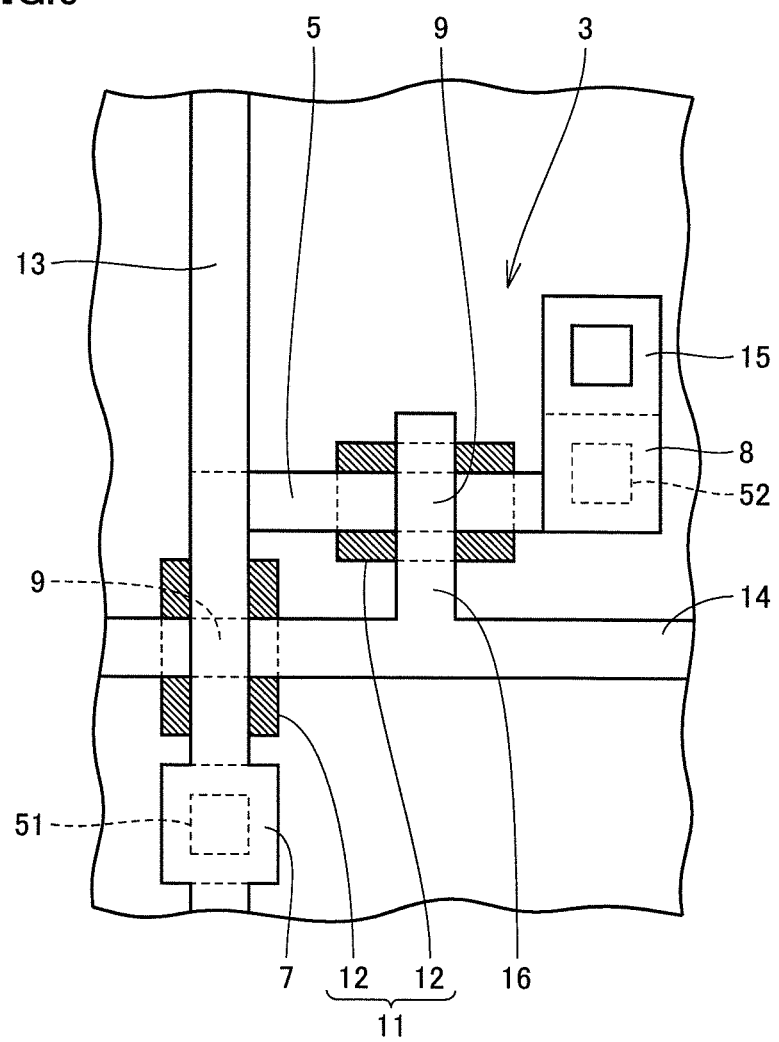
FIG. 6 is a partial plan view of a modification of the liquid crystal display panel in the first embodiment of the present invention.

FIG. 6 shows a plan view of a modification of thin film transistor 3 included in the liquid crystal display panel of the present embodiment, specifically an example of the so-called dual L-shape form. As shown in FIG. 6, semiconductor layer 5 extends in the shape of L from first portion 51 to second portion 52. In the example shown in FIG. 6, a gate branch line 16 branches from a location along gate line 14, and a part of gate branch line 16 overlaps semiconductor layer 5 to serve as gate electrode 9. In the example of FIG. 6, thin film transistor 3 also includes two gate electrodes 9 at respective locations along one semiconductor layer 5.

In this modification as well, light shielding film 11 is arranged in the form of a plurality of light shielding film elements 12 and each light shielding film 12 covers a channel region from below, and therefore, the above-described effects can be achieved.

Second Embodiment

Figure 7:
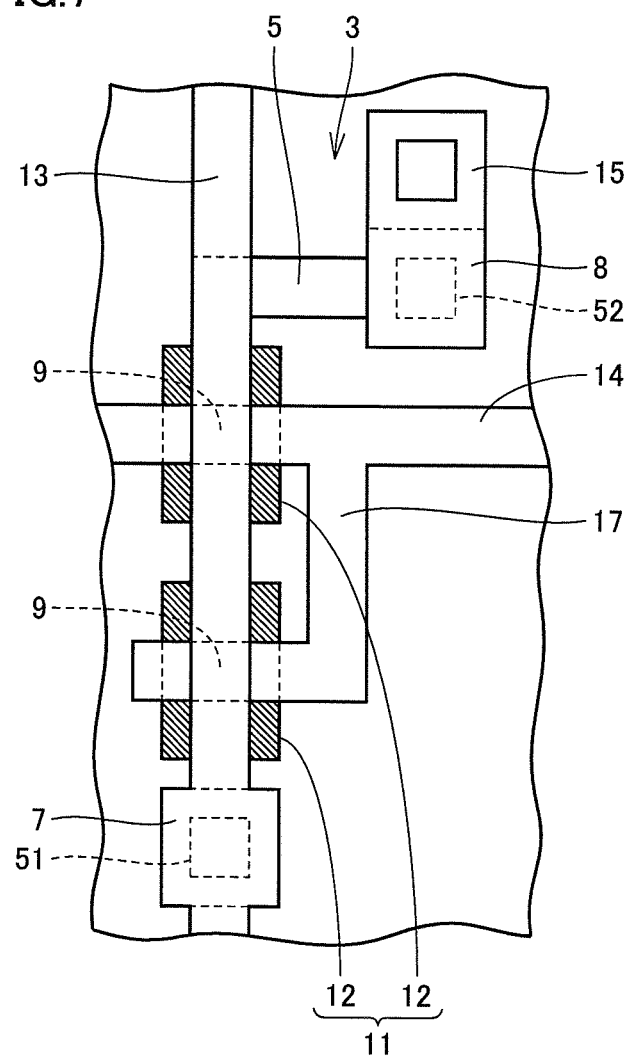
FIG. 7 is a partial plan view of a liquid crystal display panel in a second embodiment of the present invention.

Referring to FIG. 7, a liquid crystal display panel in a second embodiment of the present invention will be described. Basically, the liquid crystal display panel in the present embodiment is configured similarly to that described in connection with the first embodiment, except for the configuration of the thin film transistor. In the subsequent embodiments each, it is only the configuration of the thin film transistor that is distinguished from other embodiments. Therefore, in connection with the following embodiments each, the description is focused especially on the thin film transistor.

Thin film transistor 3 included in the liquid crystal display panel of the present embodiment is the so-called dual I-shape form. As shown in FIG. 7, semiconductor layer 5 extends from first portion 51, which is at a location overlapping source line 13, to some extent while overlapping source line 13, bends 90° to extend in parallel with gate line 14, and eventually reaches second portion 52. A gate branch line 17 branches from a location along gate line 14. Gate branch line 17 bends to extend in parallel with gate line 14 and crosses source line 13. Gate line 14 includes a portion overlapping semiconductor layer 5 and gate branch line 17 includes a portion overlapping semiconductor layer 5. These portions serve as gate electrodes 9. Thus, this thin film transistor 3 includes, as shown in FIG. 7, two gate electrodes 9 overlapping source line 13. Semiconductor layer 5 includes portions located directly below these gate electrodes 9 and these portions correspond to channel regions, respectively.

Features such as the feature that light shielding film 11 is arranged in the form of a plurality of light shielding film elements 12 is similar to the one described above in connection with the first embodiment.

This embodiment also provides a configuration in which light shielding film 11 is arranged in the form of a plurality of light shielding film elements 12 and light shielding film elements 12 each cover a channel region from below, and can therefore achieve the above-described effects.

Figure 8:
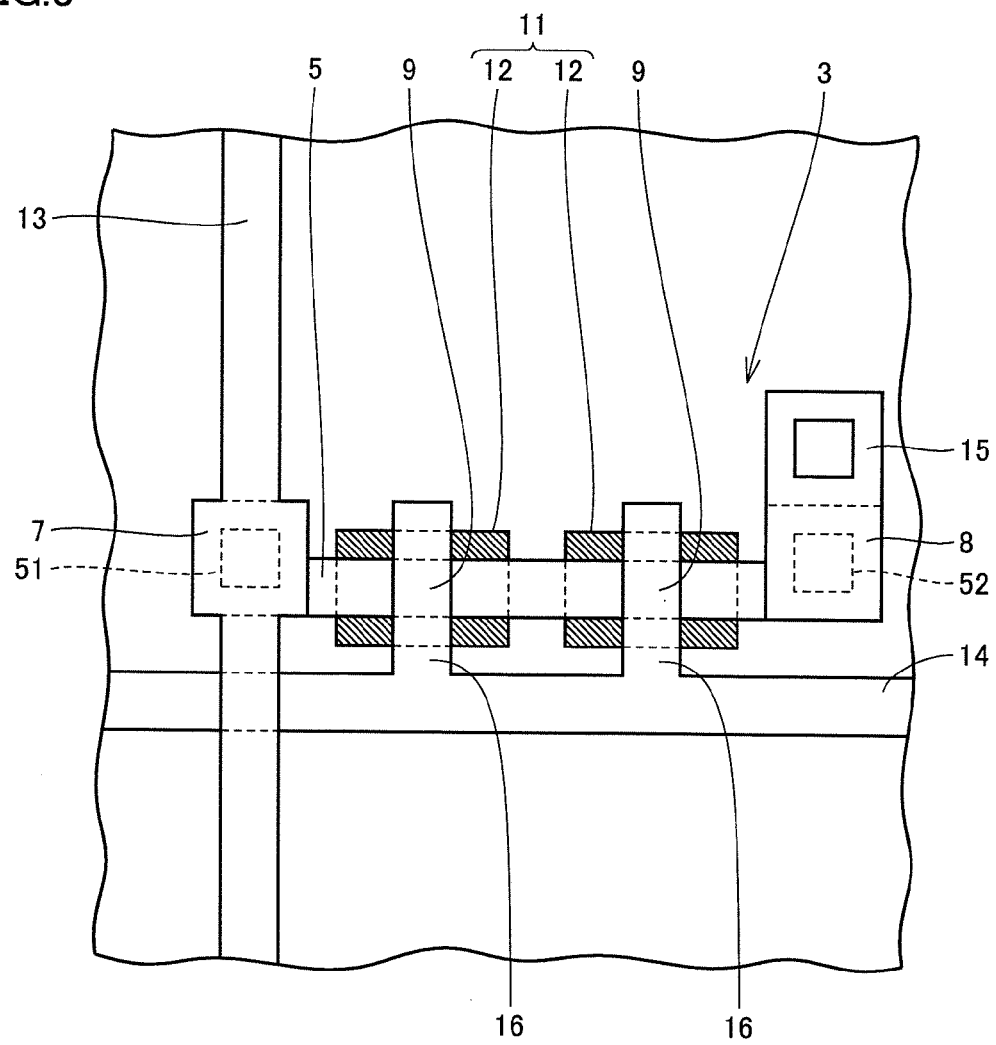
FIG. 8 is a partial plan view of a modification of the liquid crystal display panel in the second embodiment of the present invention.

FIG. 8 shows a modification of thin film transistor 3 included in the liquid crystal display panel of the present embodiment, specifically an example of the so-called dual I-shape form. Semiconductor layer 5 extends from first portion 51, which is at a location overlapping source line 13, in parallel with gate line 14 to eventually reach second portion 52. Gate branch lines 16 branch respectively from two locations along gate line 14. Each gate branch line 16 includes a portion overlapping semiconductor layer 5, and this portion serves as gate electrode 9. Thus, this thin film transistor 3 includes, as shown in FIG. 8, two gate electrodes 9 at respective locations that do not overlap source line 13 so that the gate electrodes are arranged in parallel with gate line 14. Semiconductor layer 5 includes portions located directly below these gate electrodes 9, and these portions correspond to channel regions, respectively.

This modification can also achieve the above-described effects.

Third Embodiment

Figure 9:
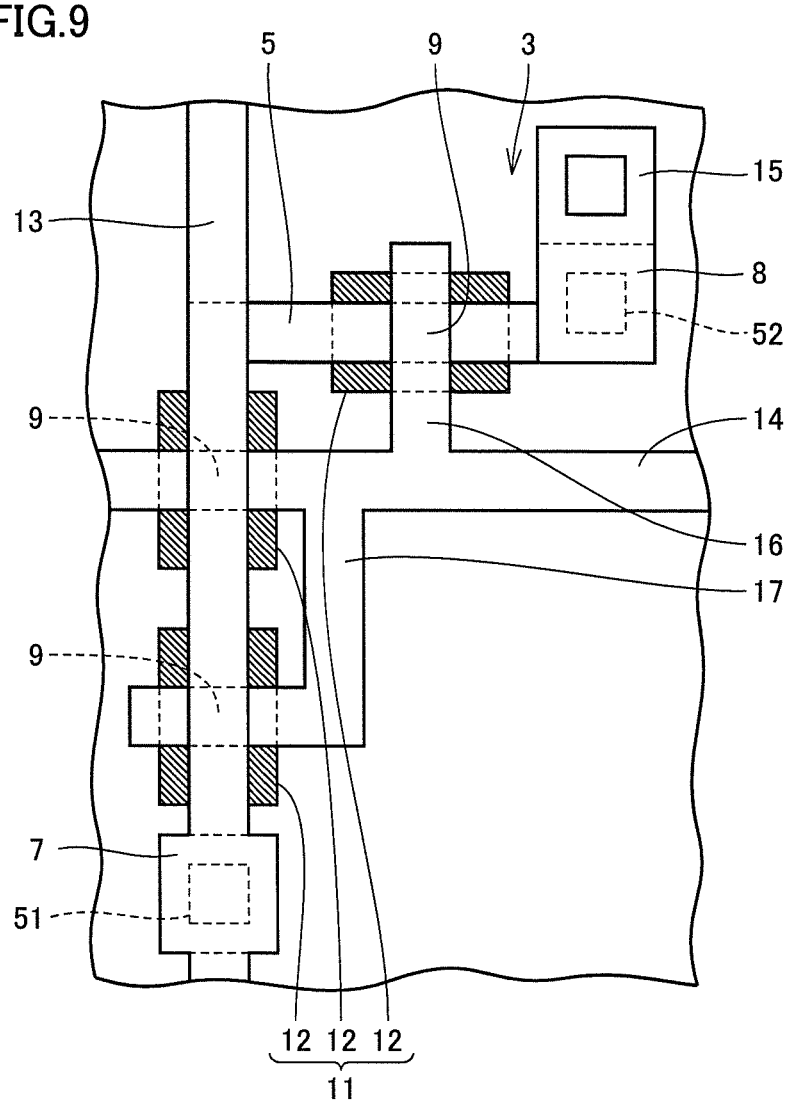
FIG. 9 is a partial plan view of a liquid crystal display panel in a third embodiment of the present invention.

Referring to FIG. 9, a liquid crystal display panel in a third embodiment of the present invention will be described. Thin film transistor 3 included in the liquid crystal display panel of the present embodiment is the so-called triple form. Semiconductor layer 5 extends from first portion 51, which is at a location overlapping source line 13, to some extent while overlapping source line 13, then bends 90°, and eventually reaches second portion 52. As shown in FIG. 9, a gate branch line 16 branches on one side from gate line 14, and a gate branch line 17 branches on the other side therefrom. Gate branch line 17 bends 90° to cross source line 13. Gate line 14 includes a portion overlapping semiconductor layer 5 to serves as a gate electrode, and gate branch lines 16, 17 include respective portions overlapping semiconductor layer 5 to serve as gate electrodes 9. Accordingly, as shown in FIG. 9, this thin film transistor 3 includes two gate electrodes 9 at respective locations overlapping source line 13, as well as one gate electrode 9 at a location which does not overlap source line 13. Thus, thin film transistor 3 of the liquid crystal display panel in the present embodiment includes three gate electrodes 9 in total. Semiconductor layer 5 includes portions located directly below these gate electrodes 9, and these portions correspond to channel regions, respectively.

The present embodiment can also achieve the effects described above in connection with the first embodiment.

Figure 10:
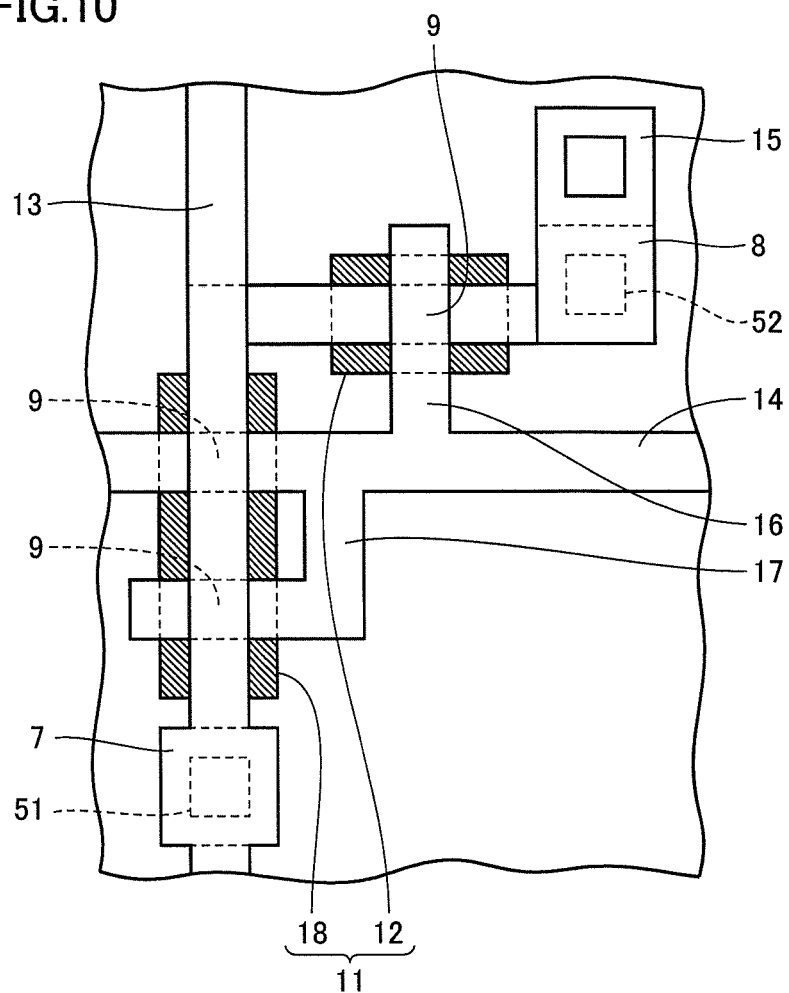
FIG. 10 is a partial plan view of a modification of the liquid crystal display panel in the third embodiment of the present invention.

A configuration as shown in FIG. 10 is also possible as a modification. In this example as well, thin film transistor 3 includes three gate electrodes 9. Namely, thin film transistor 3 has three channel regions. In the example shown in FIG. 10, a light shielding film element 18 associated with two channel regions at respective locations overlapping source line 13 is a continuous integrated element. One channel region located closest to second portion 52 is at a location which does not overlap source line 13, and a light shielding film element 12 covering this channel region is a separate and independent one.

This modification may be slightly less effective relative to the example shown in FIG. 9, because two channel regions in the modification are covered with one light shielding film element 18 from below. In the example shown in FIG. 10, however, light shielding film 11 is also in the form of a plurality of light shielding film elements 12, 18, and the light shielding film elements each cover the channel region from below. Therefore, as compared with the case where all channel regions belonging to one thin film transistor 3 are covered together by a single integrated light shielding film, the present modification is more effective in that it can suppress increase of a parasitic capacitance between a source region and a drain region sandwiching each channel region therebetween.

Figure 11:
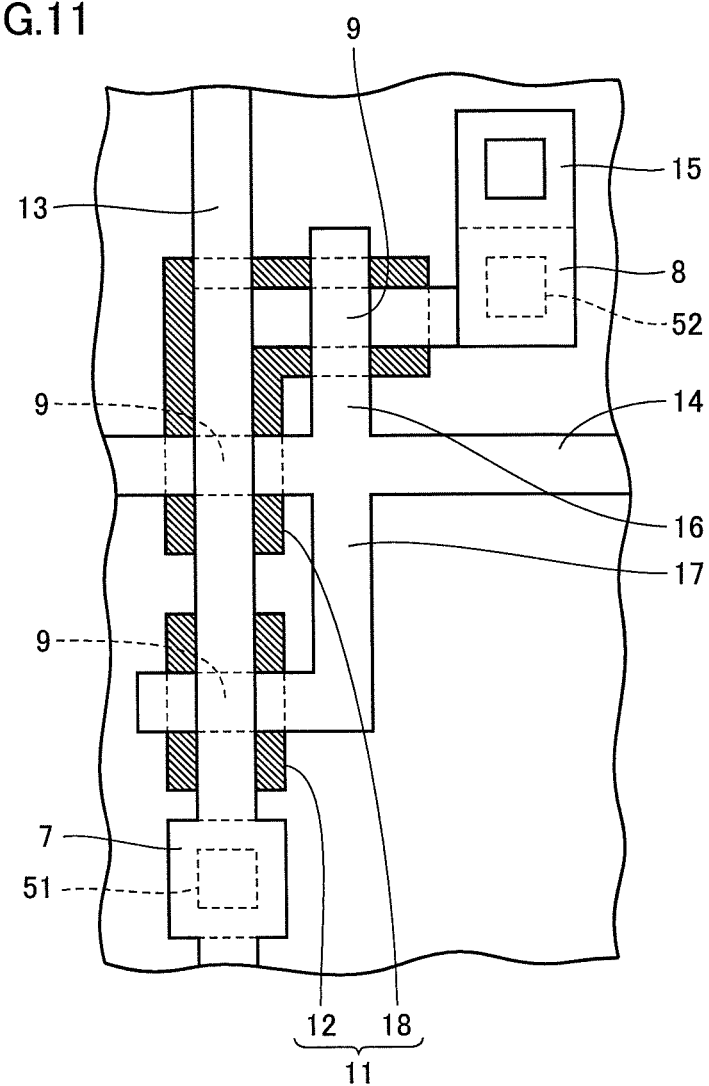
FIG. 11 is a partial plan view of another modification of the liquid crystal display panel in the third embodiment of the present invention.

A configuration shown in FIG. 11 is also possible as another modification. In this example as well, thin film transistor 3 includes three gate electrodes 9. Namely, thin film transistor 3 has three channel regions. In the example shown in FIG. 11, a light shielding film element 18 associated with one channel region at a location overlapping gate line 14 and one channel region at a location overlapping gate branch line 16 is a continuous integrated one. One channel region located closest to first portion 51 is at a location overlapping source line 13, and a light shielding film element 12 covering this channel region is a separate and an independent one.

This modification may be slightly less effective relative to the example shown in FIG. 9, because two channel regions in the modification are covered with one light shielding film element 18 from below. In the example shown in FIG. 11, however, light shielding film 11 is also in the form of a plurality of light shielding film elements 12, 18, and the light shielding film elements each cover the channel region from below. Therefore, as compared with the case where all channel regions belonging to one thin film transistor 3 are covered together by a single integrated light shielding film, the present modification is more effective in that it can suppress increase of a parasitic capacitance between a source region and a drain region sandwiching each channel region therebetween.

From a comparison between the example shown in FIG. 10 and the example shown in FIG. 11, it is seen that the light shielding film element at the position relatively closer to drain electrode 8 is smaller in the example shown in FIG. 10, which means that the influence, on drain electrode 8, of a parasitic capacitance due to the light shielding film can be reduced, and the display quality at this pixel can be improved. Accordingly, when the priority is given to the display quality, the configuration shown in FIG. 10 is preferred, as specifically described in the following.

In the liquid crystal display panel of the above embodiments each, preferably the light shielding film includes a first light shielding film element covering the projection region of the gate electrode located first closest to the second portion on the path, and a second light shielding film element covering the projection region of the gate electrode located second closest to the second portion on the path, and the first light shielding film element is arranged separately from the second light shielding film element. This configuration can be employed to reduce the influence, on the drain electrode, of a parasitic capacitance due to the light shielding film, and accordingly improve the display quality.

Further, as shown in FIGS. 4 to 9, preferably the light shielding film element is provided as a separate and independent element associated with one gate electrode. Namely, the light shielding film is preferably arranged in the form of a plurality of light shielding film elements individually separated from each other and associated with the gate electrodes on the path, respectively. This configuration can be employed to keep small a parasitic capacitance generated for the whole light shielding film.

Fourth Embodiment

Figure 12:
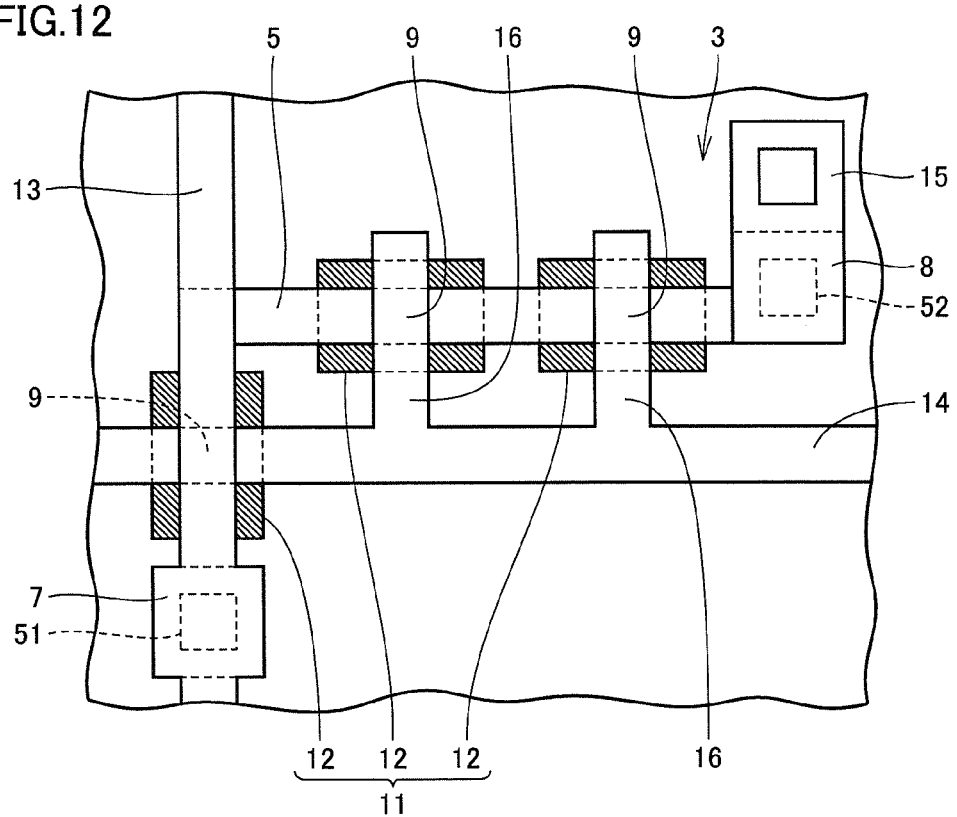
FIG. 12 is a partial plan view of a liquid crystal display panel in a fourth embodiment of the present invention.

Referring to FIG. 12, a liquid crystal display panel in a fourth embodiment of the present invention will be described. Thin film transistor 3 included in the liquid crystal display panel of the present embodiment is the so-called triple form. Semiconductor layer 5 extends from first portion 51, which is at a location overlapping source line 13, to some extent along source line 13 while crossing gate line 14, then bends 90° to extend in parallel with gate line 14, and eventually reaches second portion 52. Semiconductor layer 5 includes a portion extending in parallel with gate line 14, and this portion of semiconductor layer 5 crosses two gate branch lines 16. In this example, thin film transistor 3 has three channel regions. These channel regions are covered from below separate light shielding film elements 12 spaced from each other in plan view. Each light shielding film element 12 covers one channel region from below.

This embodiment can also achieve the effects as described above in connection with the first embodiment.

Figure 13:
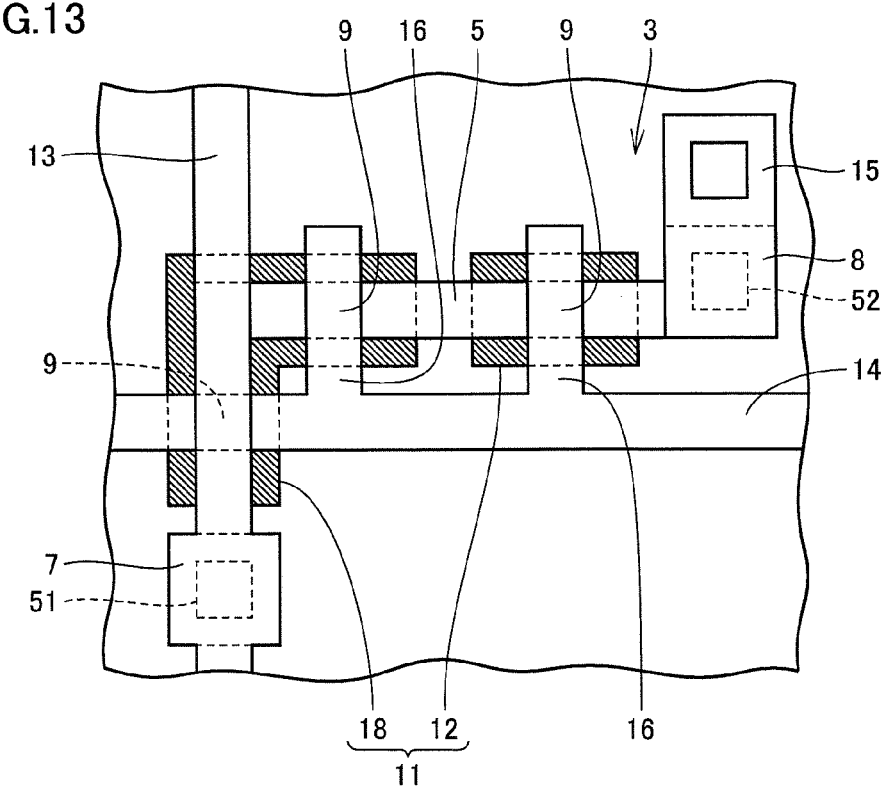
FIG. 13 is a partial plan view of a first modification of the liquid crystal display panel in the fourth embodiment of the present invention.
Figure 14:
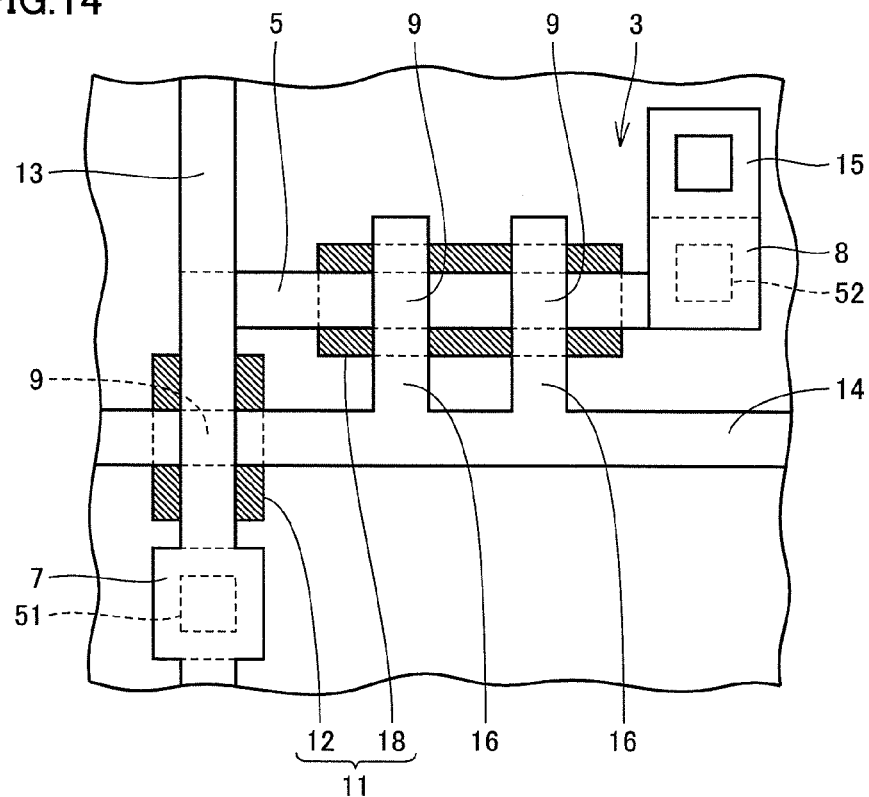
FIG. 14 is a partial plan view of a second modification of the liquid crystal display panel in the fourth embodiment of the present invention.

Configurations as shown in FIGS. 13 and 14 are also possible as modifications. In the examples shown in FIGS. 13 and 14 as well, thin film transistor 3 includes three gate electrodes 9. Namely, thin film transistor 3 has three channel regions.

The modifications shown in FIGS. 13 and 14 respectively may be slightly less effective relative to the example shown in FIG. 12, because two of the three channel regions in the modifications are covered with one light shielding film element 18 from below. In the examples shown in FIGS. 13 and 14, however, light shielding film 11 is also in the form of a plurality of light shielding film elements 12, 18, and the light shielding film elements each cover the channel region from below. Therefore, as compared with the case where all channel regions belonging to one thin film transistor 3 are covered together by a single integrated light shielding film, the present modifications are more effective in that they can suppress increase of a parasitic capacitance between a source region and a drain region sandwiching each channel region therebetween.

Fifth Embodiment

Figure 15:
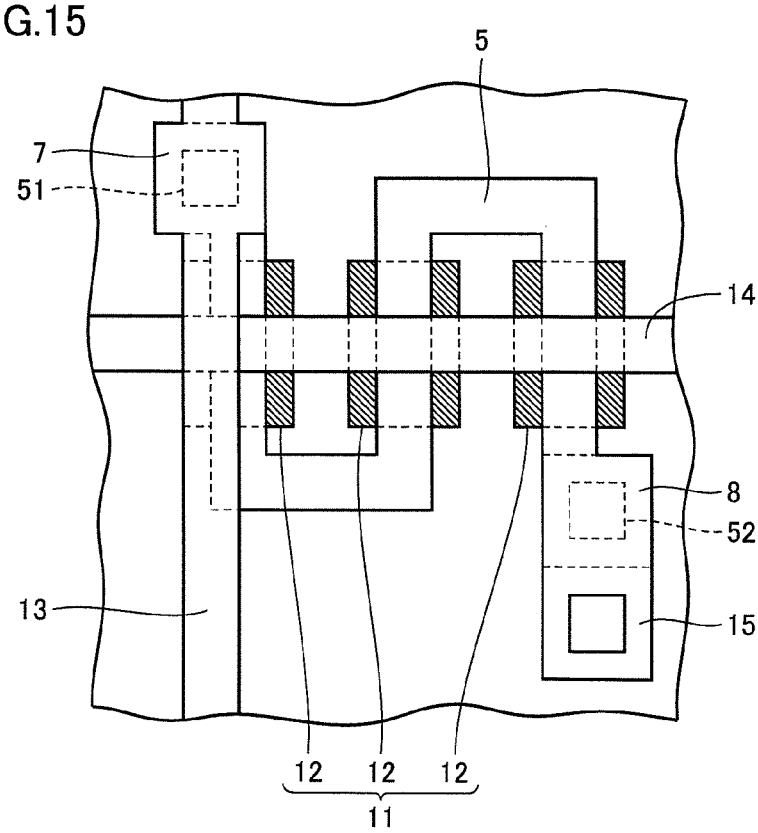
FIG. 15 is a partial plan view of a liquid crystal display panel in a fifth embodiment of the present invention.

Referring to FIG. 15, a liquid crystal display panel in a fifth embodiment of the present invention will be described. Thin film transistor 3 included in the liquid crystal display panel of the present embodiment is the so-called triple form. Semiconductor layer 5 extends from first portion 51, which is at a location overlapping source line 13, to some extent along source line 13 while crossing gate line 14, then bends away from source line 131 in the form of U-shape, crosses again gate line 14, bends again in the form of U-shape, and crosses gate line 14. This thin film transistor 3 has no gate branch line. Semiconductor layer 5 extends in the form of S-shape so that it crosses gate line 14 at three locations, and gate line 14 thus includes three portions overlapping semiconductor layer 5 to serve as gate electrodes 9, respectively. Therefore, in this example, thin film transistor 3 has three channel regions. These channel regions are covered from below separate light shielding film elements 12 spaced from each other in plan view. Each light shielding film element 12 covers one channel region from below.

This embodiment can also achieve the effects as described above in connection with the first embodiment.

Figure 16:
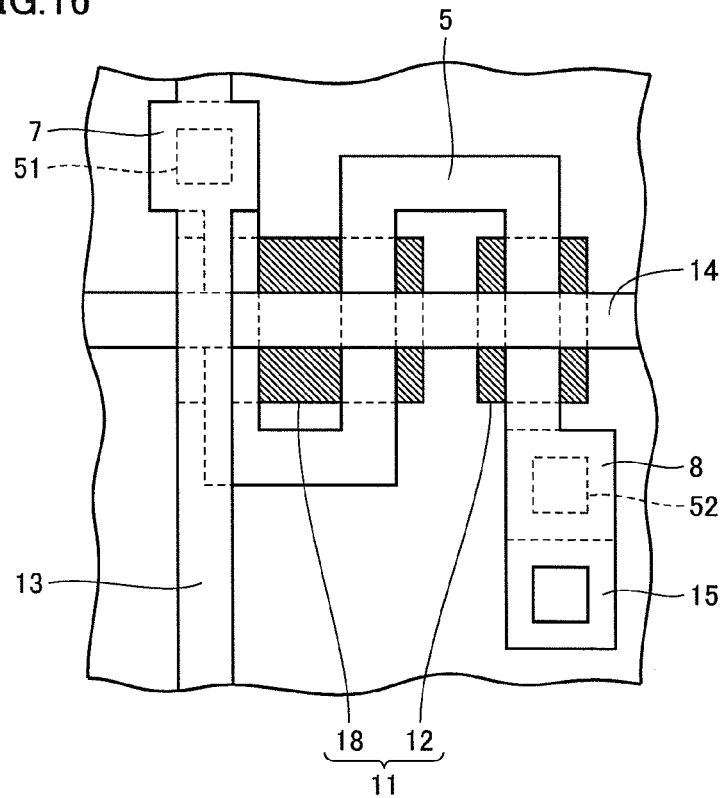
FIG. 16 is a partial plan view of a first modification of the liquid crystal display panel in the fifth embodiment of the present invention.
Figure 17:
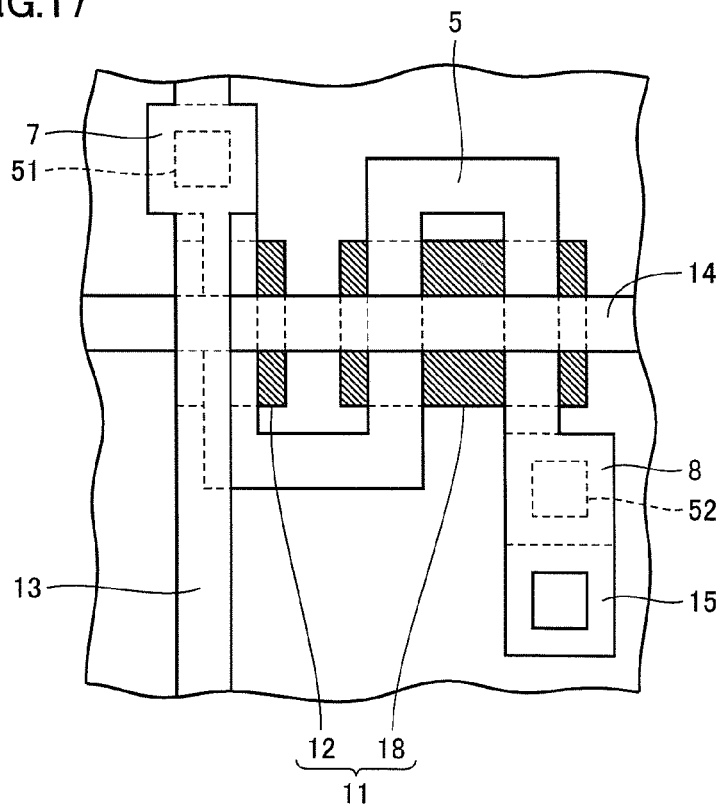
FIG. 17 is a partial plan view of a second modification of the liquid crystal display panel in the fifth embodiment of the present invention.
Figure 18:
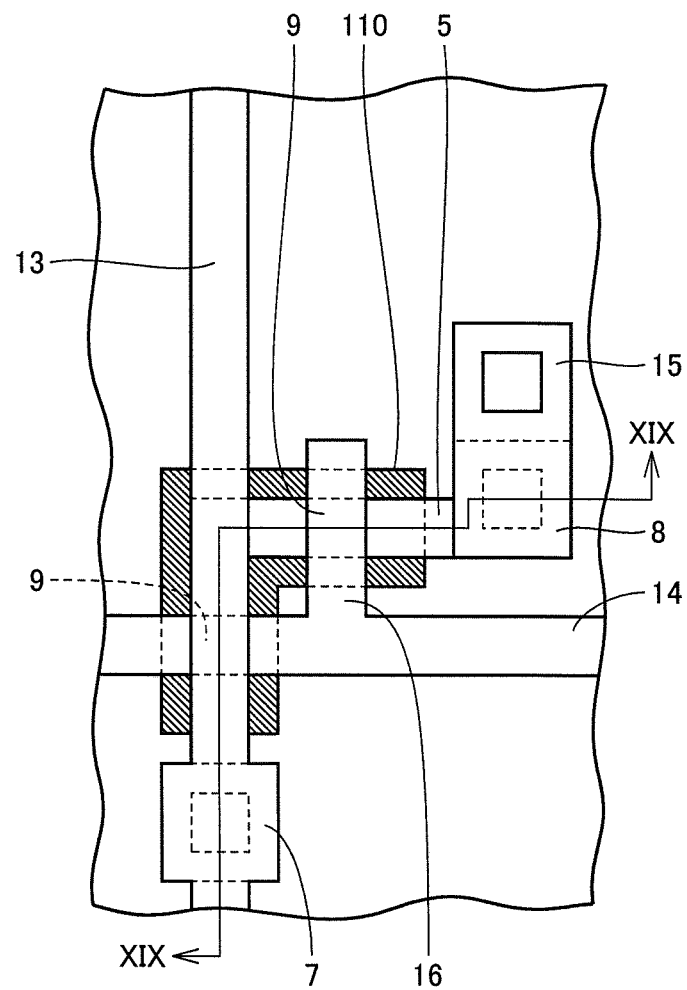
FIG. 18 is a partial plan view of a liquid crystal display panel according to a conventional art.
Figure 19:
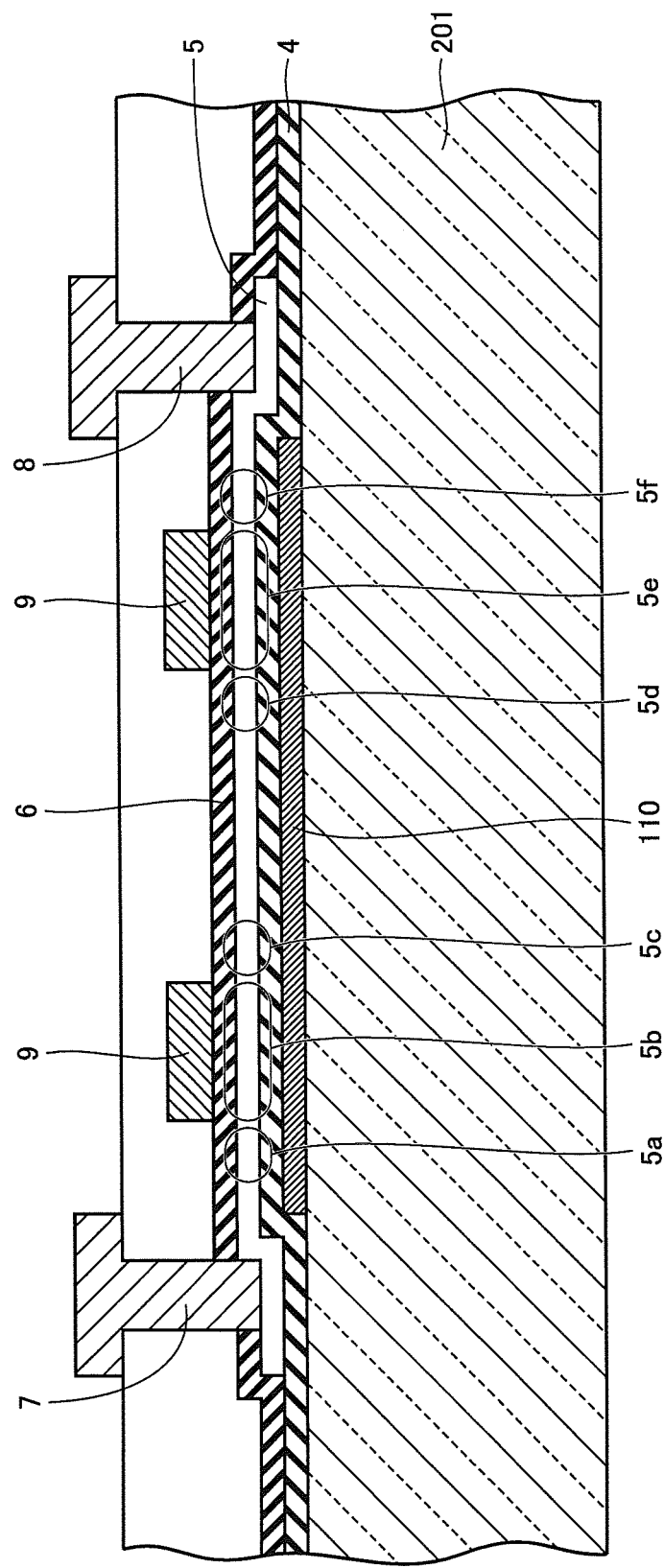
FIG. 19 is a cross-sectional view cut along a line XIX-XIX and viewed in the direction of arrows in FIG. 18.
Figure 20:
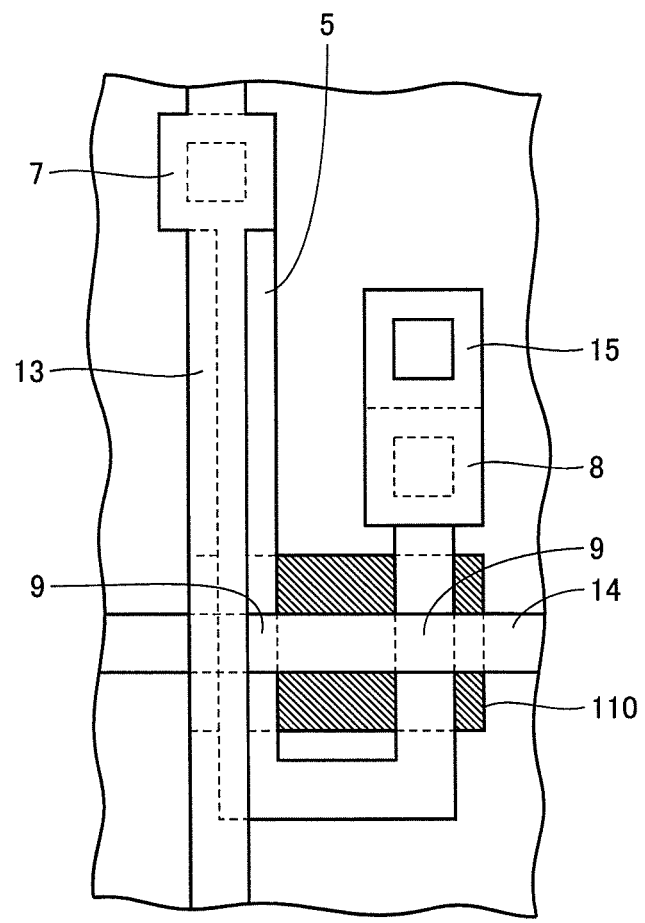
FIG. 20 is a partial plan view of a modification of the liquid crystal display panel according to the conventional art.

Configurations as shown in FIGS. 16 and 17 are also possible as modifications. In the examples shown in FIGS. 16 and 17 as well, thin film transistor 3 includes three gate electrodes 9. Namely, thin film transistor 3 has three channel regions.

The modifications shown in FIGS. 16 and 17 respectively may be slightly less effective relative to the example shown in FIG. 15, because two of the three channel regions in the modifications are covered with one light shielding film element 18 from below. In the examples shown in FIGS. 16 and 17, however, light shielding film 11 is also in the form of a plurality of light shielding film elements 12, 18, and the light shielding film elements each cover the channel region from below. Therefore, as compared with the case where all channel regions belonging to one thin film transistor 3 are covered together by a single integrated light shielding film, the present modifications are more effective in that they can suppress increase of a parasitic capacitance between a source region and a drain region sandwiching each channel region therebetween.

The liquid crystal display panel whose aperture ratio is to be increased may be as follows.

In the liquid crystal display panel, preferably a gate line extending in a first direction and a source line extending in a second direction perpendicular to the first direction and electrically connected to the source electrode are arranged in the main surface, the gate electrode is electrically connected with the gate line or is a part of the gate line, and the path at least partially overlaps the source line and at least one of the light shielding film elements is at a location overlapping the source line in plan view. The examples shown in FIGS. 5 to 7 and FIGS. 9 to 17 meet this condition. This configuration can be employed so that at least one of the light shielding film elements is at a location overlapping the source line, to thereby reduce the extent to which the aperture ratio is decreased by the light shielding film element per pixel as a whole, and accordingly improve the aperture ratio. Particularly in the examples shown in FIGS. 7 and 9 to 11, two light shielding film elements are at respective positions overlapping the source line, and accordingly, the extent to which the aperture ratio is decreased by the light shielding film elements can be reduced per pixel as a whole, which is effective in improving the aperture ratio.

The liquid crystal display panel whose power consumption is to be reduced may be as follows.

In the liquid crystal display panel, preferably a gate line extending in a first direction and a source line extending in a second direction perpendicular to the first direction and electrically connected to the source electrode are arranged in the main surface, the gate electrode is electrically connected with the gate line or is a part of the gate line, and the light shielding film elements are all arranged at respective positions that do not overlap the source line in plan view. The example shown in FIG. 8 meets this condition. This configuration can be employed so that none of the light shielding film elements overlaps the source line, to thereby reduce the load exerted on the source line, and reduce the power consumption per pixel as a whole.

While the foregoing description in connection with each embodiment above has been given of the example where the number of the channel regions is two or three, the present invention is applicable as well to four or more channel regions.

It should be construed that embodiments disclosed herein are by way of illustration in all respects, not by way of limitation. It is intended that the scope of the present invention is defined by claims, not by the description above, and encompasses all modifications equivalent in meaning and scope to the claims.

INDUSTRIAL APPLICABILITY

The present invention is applicable to liquid crystal display panels.

REFERENCE SIGNS LIST 1 display region; 2 pixel; 3 thin film transistor; 4 base insulating film; 5 semiconductor layer; 5a, 5d source region; 5b, 5e channel region; 5c, 5f drain region; 6 gate insulating film; 7 source electrode; 8 drain electrode; 9 gate electrode; 10 projection region; 11, 110 light shielding film; 12, 18 light shielding film element; 13 source line; 14 gate line; 15 contact; 16, 17 gate branch line; 51 first portion; 52 second portion; 91 projection region; 201 first transparent substrate; 201u main surface; 202 second transparent substrate; 203 liquid crystal layer; 204 seal member

The invention claimed is:

1. A liquid crystal display panel, comprising:
a first transparent substrate having a main surface which includes a display region having a plurality of pixels;
a second transparent substrate arranged opposite to said main surface in at least a region including said display region; and
a liquid crystal layer arranged to be sandwiched between said first transparent substrate and said second transparent substrate,
thin film transistors associated with said plurality of pixels respectively being provided in said main surface,
said thin film transistors each including, in order of closeness to said first transparent substrate:
  a base insulating film covering at least a part of said main surface;
  a semiconductor layer extending linearly at least from a first portion to a second portion in plan view to cover a part of said base insulating film;
  a gate insulating film covering at least a part of said semiconductor layer;
  a source electrode electrically connected, in said first portion, to said semiconductor layer;
  a drain electrode electrically connected, in said second portion, to said semiconductor layer; and
  gate electrodes arranged at two or more locations, respectively, to cover said semiconductor layer with said gate insulating film interposed therebetween, said two or more locations being located along a path extending along said semiconductor layer from said first portion to said second portion in plan view, wherein
a light shielding film being arranged between said base insulating film and said first transparent substrate to cover each projection region of said main surface, said projection region being a region corresponding to projection of said gate electrode on said main surface,
said light shielding film being arranged in the form of a plurality of light shielding film elements separated from each other in plan view, said light shielding film elements each covering one or more said projection regions of said gate electrodes, a gate line extending in a first direction and a source line extending in a second direction perpendicular to said first direction, the source line being electrically connected to said source electrode, both of the gate line and the source line are arranged in said main surface, said gate electrode is electrically connected with said gate line or is a part of said gate line, and said path at least partially overlaps said source line and at least one of said light shielding film elements is at a location overlapping said source line in plan view.

2. The liquid crystal display panel of claim 1, wherein a total width of the light shielding film in the first direction is greater than a total width of the gate electrode in the first direction.

* * * * *